United States Patent
Guilloy et al.

(10) Patent No.: US 9,502,864 B2
(45) Date of Patent: Nov. 22, 2016

(54) DEVICE COMPRISING A STRAINED GERMANIUM MEMBRANE

(71) Applicant: COMMISSARIAT A L'ENERGIE ATOMIQUE ET AUX ENERGIES ALTERNATIVES, Paris (FR)

(72) Inventors: Kévin Guilloy, Grenoble (FR); Nicolas Pauc, Sassenage (FR); Vincent Calvo, Fontaine (FR); Vincent Reboud, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/742,971

(22) Filed: Jun. 18, 2015

(65) Prior Publication Data

US 2015/0372454 A1    Dec. 24, 2015

(30) Foreign Application Priority Data

Jun. 23, 2014    (FR) .................... 14 55805

(51) Int. Cl.

| H01S 5/183 | (2006.01) |
| --- | --- |
| B81B 3/00 | (2006.01) |
| H01S 5/10 | (2006.01) |
| H01S 5/30 | (2006.01) |

(52) U.S. Cl.
CPC ......... *H01S 5/18319* (2013.01); *B81B 3/0072* (2013.01); *H01S 5/105* (2013.01); *H01S 5/3027* (2013.01); *B81B 2201/047* (2013.01); *B81B 2203/0109* (2013.01); *B81B 2203/0127* (2013.01); *B81B 2203/0163* (2013.01); *B81C 2201/017* (2013.01)

(58) Field of Classification Search
CPC .. H01S 5/18319; H01S 5/3027; H01S 5/105; B81B 3/0072
See application file for complete search history.

(56) References Cited

FOREIGN PATENT DOCUMENTS

GB    2501307 A    10/2013

OTHER PUBLICATIONS

Sukhdeo David et al: "Mimicking heterostructure behavior Within a single material at room temperature using strain" 2014 Conference on Lasers an[) Electro-Optics (CLEO)—Laser to Photonic Science Applications the Optical Society, Jun. 8, 2014 (21)Jun. 8, 2014), pp. 1-2, XP032708222.*
Sukhdeo et al., "Mimicking Heterostructure Behavior Within a Single Material at Room Temperature Using Strain", Optical Society of America, Conference on Lasers and Electro-Optics (CLEO), Jun. 8, 2014; cited in the French Search Report; in English (2 pages).

(Continued)

*Primary Examiner* — Dung Nguyen
(74) *Attorney, Agent, or Firm* — Westerman, Hattori, Daniels & Adrian, LLP

(57) ABSTRACT

Optical and/or electronic device comprising a suspended, germanium-based membrane (20) and comprising an active zone (21) placed under tension by tensioning arms (23), said device being characterized in that it comprises at least one tensioning arm (23) comprising nonparallel lateral sides (32), the width of which increases with distance from the active zone (21).

20 Claims, 7 Drawing Sheets

(56) References Cited

OTHER PUBLICATIONS

Shah et al., "Tensile strained Ge membranes", IEEE, 15th International Conference on Ultimate Integration on Silicon (ULIS), Apr. 7, 2014, pp. 137-140; cited in the French Search Report; in English (4 pages).

French Search Report and Written Opinion dated Feb. 24, 2015, issued in corresponding application No. FR 1455805; w/ English partial translation and partial machine translation (12 pages).

* cited by examiner

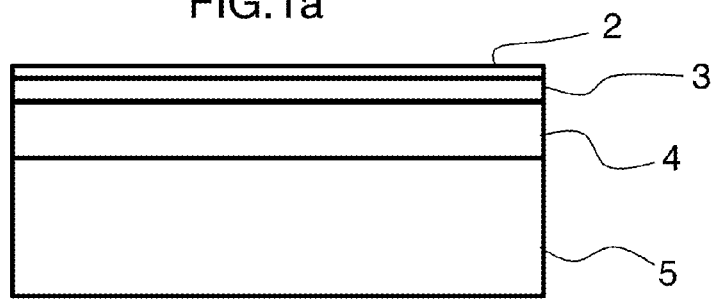
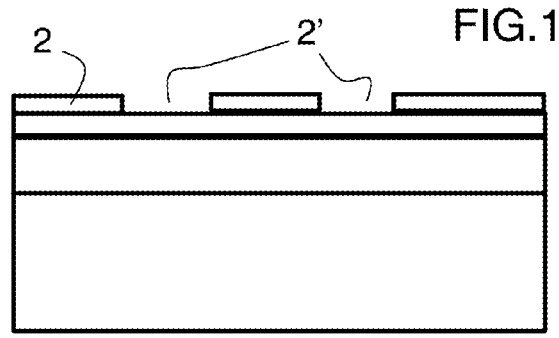
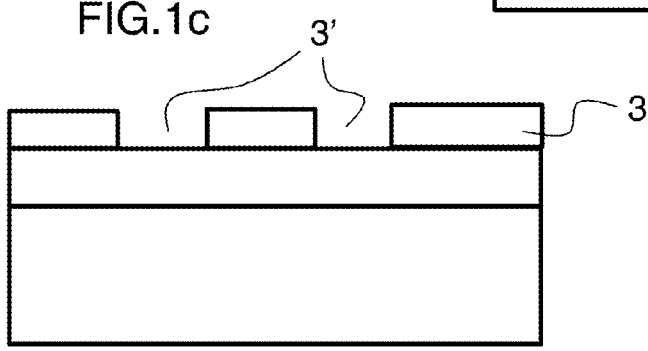
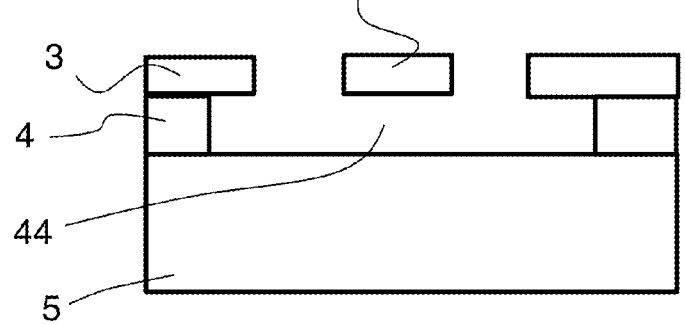

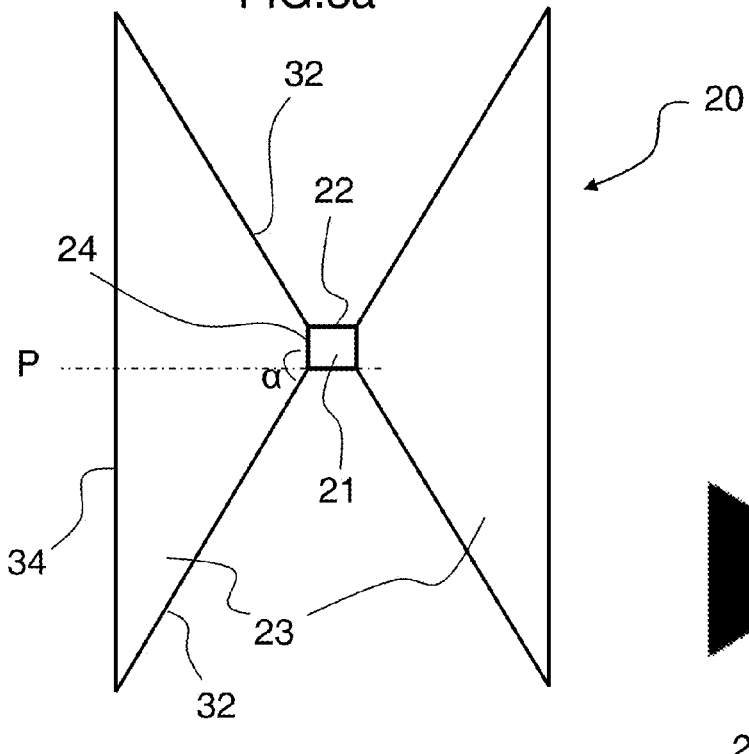
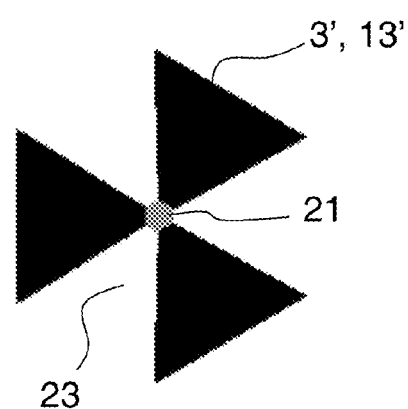
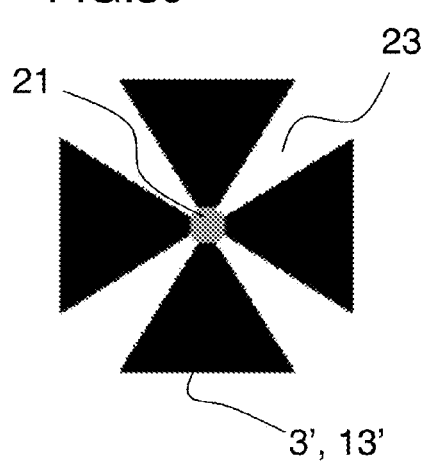
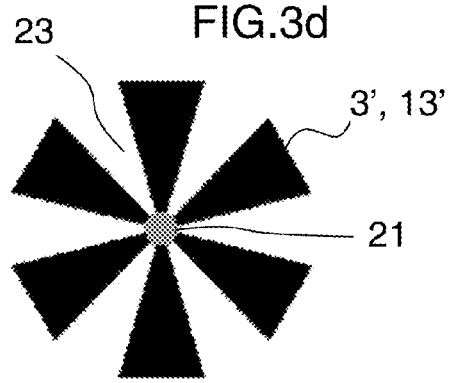

DEVICE COMPRISING A STRAINED GERMANIUM MEMBRANE

The invention relates to an optical and/or electronic device comprising a germanium-based membrane placed under tension. It also relates to a process for fabricating such a device.

It is known that applying a strain to a crystal of germanium allows its electronic structure and physical structure to be modified. In particular, its deformation makes it possible to change such a crystal of germanium into a direct bandgap semiconductor and to shift its optical emission and sensitivity to wavelengths longer than its undeformed direct bandgap of 1.55 µm. Applications of these effects have been tried, relying on a suspended germanium membrane placed under tension by arms. However, existing methods remain limited because they have all or some of the following drawbacks:

- the strains exerted during the process for fabricating the germanium membrane are too great, thereby limiting the intensity of the accessible tension in order to prevent rupture of the membrane;
- the tensions exerted are nonuniform, forming weak points in the membrane, thereby also limiting the intensity of the maximum applicable tension and inducing a nonuniform behaviour that is disadvantageous in certain applications.

Thus, a general aim of the invention is therefore to provide a solution for forming a device comprising germanium under tension, which does not have all or some of the drawbacks of existing solutions.

For this purpose, the invention is based on an optical and/or electronic device comprising a suspended, germanium-based membrane and comprising an active zone placed under tension by tensioning arms, said device being characterized in that it comprises at least one tensioning arm comprising nonparallel lateral sides, the width of which increases with distance from the active zone. The lateral sides make an obtuse angle to the active zone at the junction between the tensioning arm and the active zone.

It may comprise at least one trapezoidal-shaped tensioning arm.

All the tensioning arms may have the same shape and be distributed regularly about the active zone.

The optical and/or electronic device may comprise at least three tensioning arms.

It may comprise a substantially polygonal active zone, especially forming a regular polygon, the number of sides of which is a multiple of the number of tensioning arms.

It may comprise links that are rounded on the periphery of the active zone connecting two tensioning arms.

The optical and/or electronic device may be a diode, a transistor, a light-emitting device, a laser, a photodetector or a substrate.

The optical and/or electronic device may be an optical device that comprises a first mirror under the germanium-based membrane and/or a second mirror above the germanium-based membrane.

The invention also relates to a process for fabricating an optical and/or electronic device, characterized in that it comprises the following steps:

- etching a germanium-based layer in order to form at least one tensioning arm comprising nonparallel lateral sides, the width of which increases with distance from an active zone, and the lateral sides of which make an obtuse angle to the active zone at the junction between the tensioning arm and the active zone; and
- etching a sacrificial layer under the germanium-based layer in order to obtain a suspended, germanium-based membrane comprising the active zone and the at least one tensioning arm.

The step of etching the sacrificial layer may extend gradually from the centre of the membrane, level with the active zone, as far as the outside edge of the tensioning arms.

The process for fabricating an optical and/or electronic device may comprise a step of depositing a reflective layer in order to form a mirror, especially of aluminium, under the membrane and/or a second step of depositing a reflective layer in order to form a mirror on the membrane.

These objects, features and advantages of the present invention will be discussed in detail in the following description of a particular nonlimiting embodiment given with regard to the appended figures, in which:

FIGS. 1a to 1d schematically show steps of a process for fabricating a tensilely-strained germanium-comprising structure according to a first embodiment of the invention.

FIGS. 2a to 2d schematically show steps of a process for fabricating a tensilely-strained germanium-comprising structure according to a second embodiment of the invention.

FIGS. 3a to 3d schematically show top views of tensilely-strained germanium membranes of devices according to a plurality of variant embodiments of the invention.

Figure 2A:
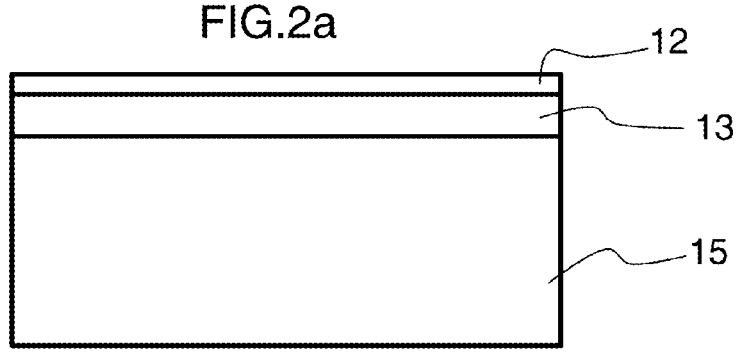

FIG. 1a shows a schematic cross-sectional side view of a structure 1 produced in a first phase of a process for fabricating a device according to a first embodiment of the invention. This structure 1 comprises a very thin upper layer 2 of silicon oxide, for example from a few nanometers to 100 nm, which covers a layer 3 made of germanium, of thickness of about 100 nm to a few microns. It then comprises a layer 4 of silicon oxide, of thickness of about 1 µm. This multilayer is arranged on a silicon substrate 5.

FIG. 1b shows the result obtained after a first step consisting in patterning by lithography the upper first layer 2, for example using a negative resist, before etching the silicon oxide, for example using an argon etch. An upper layer 2 forming a hard mask comprising through-apertures 2' results therefrom.

FIG. 1c shows the structure after a step of etching of the germanium, for example carried out using a reactive ion etching (RIE) technique. This etching step reproduces in the layer 3 of germanium the patterns formed in the upper layer 2, in order to form through-apertures 3' in the germanium layer, these apertures 3' being superposed with the apertures 2' in the upper layer 2.

FIG. 1d shows the final structure obtained after the layer 4 of silicon oxide placed under the germanium has been etched, for example in HF vapour or liquid HF, until the membrane is freed, i.e. the etching is stopped when it reaches laterally the base of the tensioning arms. This results in a germanium membrane 20 suspended above a cavity 44 formed in the layer 4 of silicon oxide, above the silicon substrate 5. The layer 4 of silicon oxide therefore serves here as a sacrificial layer and, following its removal by etching, the germanium membrane 20 is automatically placed under tension by virtue of the intrinsic properties of the resulting structure.

FIG. 2a shows a schematic cross-sectional side view of a structure 11 produced in a first phase of a process for fabricating a device according to a second embodiment of the invention. This structure 11 likewise comprises an upper layer 12 of silicon oxide, which covers a layer 13 made of germanium, itself grown epitaxially on a silicon substrate 15.

Figure 2B:
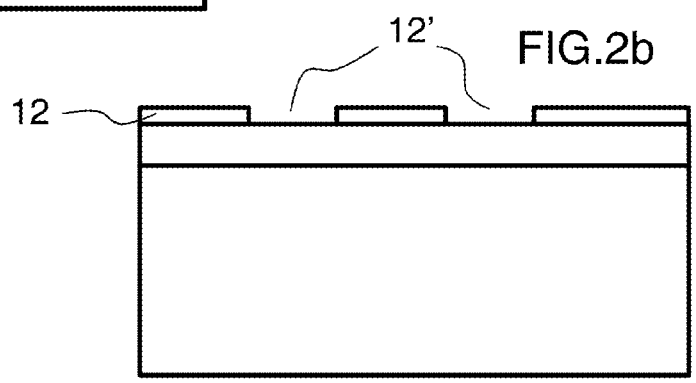

FIG. 2b shows the result obtained after a first step similar to the step described in the first embodiment, consisting in patterning lithographically the upper first layer 12 and in etching the silicon oxide to form an upper layer 12 containing through-apertures 12', in order to form a mask for the next step of etching the germanium.

Figure 2C:
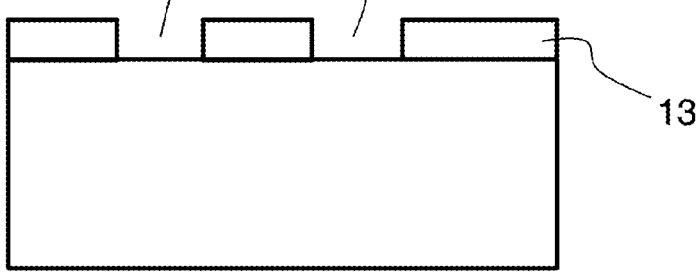

Thus, FIG. 2c shows the structure that results after this step of etching the germanium, which reproduces in the germanium layer 13 the patterns in the upper layer 12, thereby forming through-apertures 13' in the germanium layer, these apertures 13' being superposed with the apertures 12' in the upper layer 12.

Figure 2D:
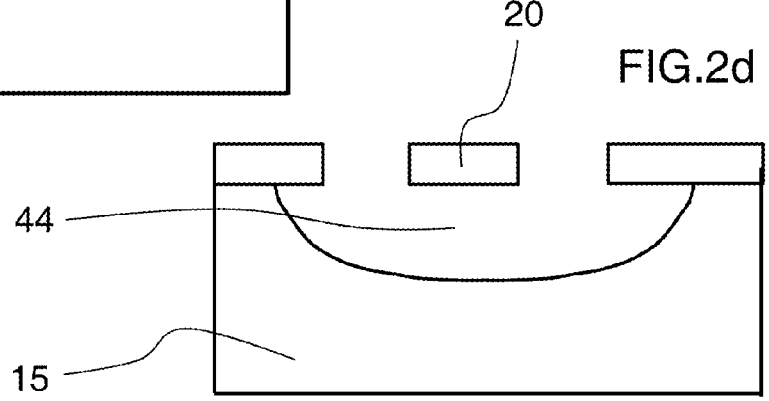

FIG. 2d shows the final structure obtained after the layer 15 of silicon has been etched to form a cavity 44 placed under the germanium, this etch for example being a wet etch in tetramethyl ammonium hydroxide (TMAH), this etch etching the silicon selectively over the germanium to a sufficient depth to free the membrane. In this second embodiment, the silicon layer 15 therefore provides the sacrificial layer function. A suspended, tensilely-strained germanium membrane 20 results therefrom.

As will be clear from the above description of these two embodiments, the processes used are advantageously similar to and compatible with the CMOS processes used to fabricate electronic components based on silicon.

Depending on the embodiment of the invention in question, the etches carried out in the above fabrication process steps to form the apertures 2', 3', 12', 13', in order to obtain finally a suspended germanium membrane 20, have one of a number of particularly advantageous shapes. FIGS. 3a to 3d show by way of exemplary embodiments germanium membranes 20 having shapes according to various variant embodiments of the invention. Specifically, these figures show top views of structures such as shown in cross section from the side in FIGS. 1d and 2d. Each membrane 20 has a central portion, called the active zone 21 or zone of interest, on which, under the effect of tensioning arms 23 connecting the active zone 21 to the rest of the structure, the tension is concentrated, this tension making it possible to give the active zone 21 advantageous structural, electronic and optical properties.

According to one advantageous embodiment, the active zone 21 takes the form of a regular polygon having rotational symmetry. In the exemplary embodiments of FIGS. 3a to 3d, this polygon comprises 4 (particular case of a square), 6, 8 and 12 sides, respectively. As a variant embodiment, this polygon, while remaining rotationally symmetric, could be irregular and for example rectangular or truncated-rectangle shaped, etc.

According to one advantageous embodiment, the tensioning arms 23 are connected to one side 24 in two 24, 22 of the polygon forming the active zone 21. As a variant, any combination of a certain number of tensioning arms 23 associated with an active zone comprising a number of sides that is a multiple of the number of tensioning arms could be envisaged, the tensioning arms favourably being distributed regularly and symmetrically about the active zone.

Figure 6:
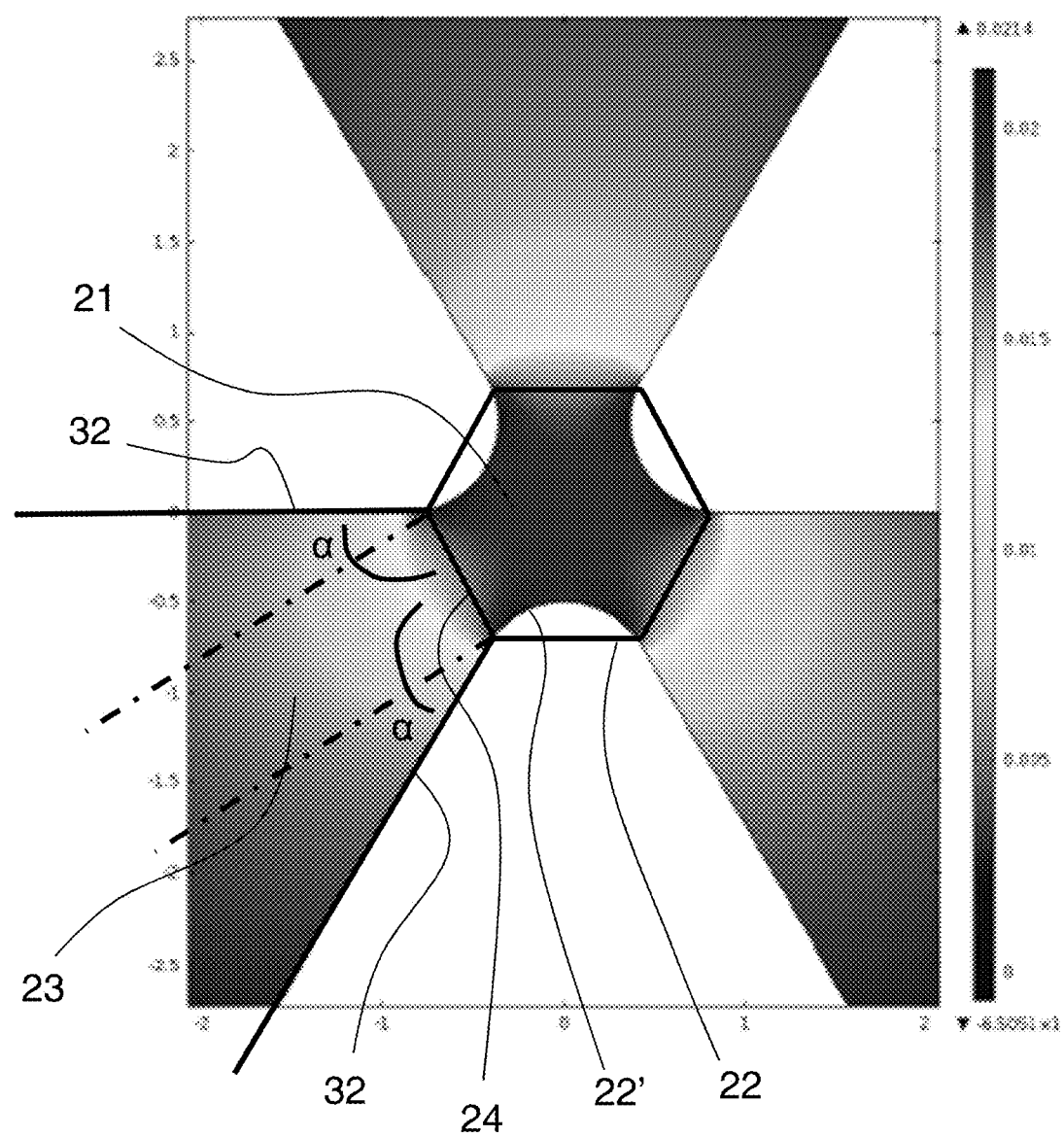
FIG. 6 shows the deformation levels obtained for a membrane according to another exemplary embodiment of the invention.

In addition, as is more particularly shown in FIGS. 3a and 6, but as is also the case in the examples in FIGS. 3b to 3d, the tensioning arms 23 advantageously have trapezoidal shapes, comprising a short side 24 at the junction with the active zone 21, by definition parallel to one side of the active zone 21, and a longer side 34 opposite, parallel to the short side 24, said sides being connected by two lateral sides 32. Each tensioning arm 23 advantageously has a shape the width of which increases with distance from the active zone 21. Each lateral side 32 of a tensioning arm 23 makes an obtuse angle a to the side 24 of the active zone 21 to which it is connected, and therefore an angle larger than 90 degrees. The lateral side 32 is located beyond the perpendicular P to the side 24 of the active zone 21, giving the tensioning arm 23 a flared shape. The two lateral sides 32 of a tensioning arm 23 are not parallel to one another. They preferably extend symmetrically about the side 24 of the active zone 21, in order to exert uniform stresses on the active zone 21.

The geometric choices specified above allow the following advantages to be achieved:
  the deformation of the germanium membrane at the junction 24 between the active zone 21 and the tensioning arms 23 is improved and may be increased without running the risk of breaking the germanium structure, in particular due to the obtuse angles of the angles present at these junctions, which make the structure very strong;
  using tensioning arms 23 the width of which increases with distance from the active zone, these arms 23 especially being of flared shape, of trapezoidal shape for example, makes it possible to combine the advantage of being able to exert a high force on the active zone while using many, preferably 3 or more, tensioning arms, without running the risk of these arms overlapping at the active zone, which is small in size;
  furthermore, the fact of selecting a width for the tensioning arms corresponding to the length of the sides 24 of the active zone allows the number of tensioning arms linked to the active zone to be multiplied and in particular at least three thereof to be used; and
  using tensioning arms 23 having a width that increases with distance from the active zone also allows a step of etching of the germanium to be carried out without exerting too great a force on the tensioning arms 23. To do this, such a step will advantageously start with etching of the sacrificial layer level with the active zone, the etching gradually progressing outwards from the active zone until the tensioning arms are completely freed, thereby gradually placing the active zone under tension.

Figure 4:
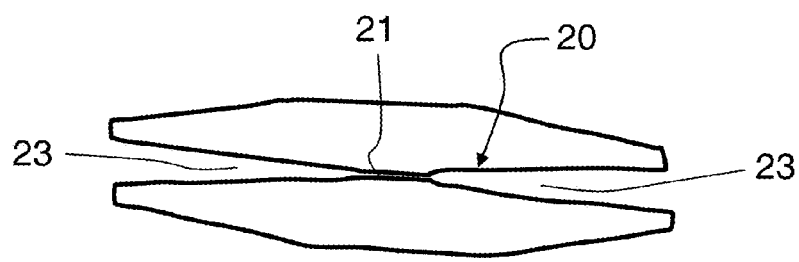
FIG. 4 shows a top view of a tensilely-strained germanium membrane of a device according to one embodiment of the invention.

Naturally, the geometries shown in FIGS. 3a to 3d are intentionally schematic and perfect. In fact, the shapes obtained will be less regular and less perfect but will approach these shapes. By way of example, FIG. 4 shows the shape obtained for an actual fabricated example of a membrane 20 having two tensioning arms 23, the shape of this membrane 20 approaching the shape in FIG. 3a.

Figure 5A:
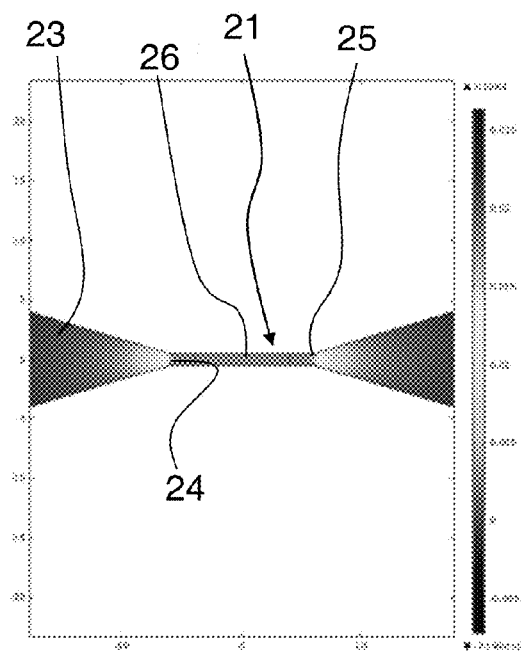
FIGS. 5a and 5b show the deformation levels obtained for a membrane according to a first exemplary embodiment of the invention and for a membrane not according to the invention, respectively.
Figure 5B:
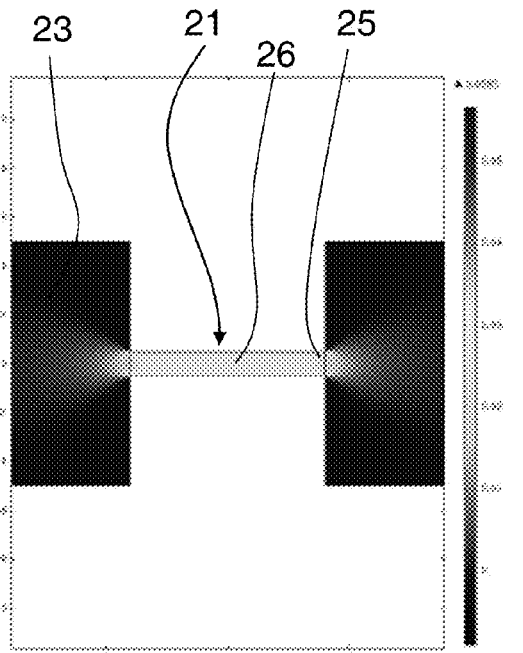

FIGS. 5a and 5b show deformation levels obtained using a computer for a membrane according to one embodiment of the invention and for a membrane of the same size but not according to the invention, respectively. In the two simulations, the active zone 21 has a width of 1 µm for a length of 8 µm, and the tensioning arms 23 have a length of 28 µm. It would appear that with two trapezoidal-shaped arms according to the embodiment of the invention, shown in FIG. 5a, the deformation (and therefore the strain) obtained in the membrane is of good uniformity, the ratio of the maximum deformation observed in the corners 25 of the active zone at the junction 24 with the tensioning arms 23 to the deformation at the centre 26 more precisely being about 1.45. In the simulated comparative example with two rectangular tensioning arms 23, shown in FIG. 5b, the same ratio is 2.57. As a result it is possible to apply a much higher maximum deformation with the embodiment shown in FIG. 5a before the germanium membrane ruptures.

FIGS. 6 illustrates the uniformity of the distribution of deformation in a membrane comprising three trapezoid-shaped tensioning arms 23 in an embodiment similar to the geometry of FIG. 3b. It will be noted that, in this embodiment, it would also appear to be advantageous to make the sides 22' of the active zone 21 between two tensioning arms 23 curved, the sides 22 of the regular polygon being replaced with these curved sides 22'. Thus, in this embodiment, the periphery of the active zone 21 comprises rounded links between neighbouring tensioning arms 23, forming a concave active zone 21. This approach allows corners to be removed, thereby further diminishing zones of high strain. Thus, when the active zone 21 of the membrane 20 is said to have a polygonal shape according to the invention, this is also understood to mean a shape with curved sides 22'. With an embodiment according to FIG. 6, a deformation of 1.9% of the membrane may be applied while preserving a deformation ratio of only 1.13, this demonstrating a high uniformity in the distribution of strain within the active layer.

Variant embodiments were illustrated above by way of nonlimiting example. Naturally, other membrane shapes may be chosen without departing from the scope of the invention. In particular, all the tensioning arms need not be identical, even though it is advantageous to use arms of the same shape, uniformly distributed about the active zone, in order to attempt to obtain the most uniform geometry possible. It is generally also preferable to use at least three tensioning arms.

Finally, the invention is implemented provided that at least one tensioning arm 23 has a width that increases with distance from the active zone, at least over some of its length. In addition, tensioning arms linked to an active zone over a width corresponding to one side 24 of a polygon of the active zone have been described. Naturally, the active zone may have other shapes and the link between a tensioning arm 23 and the active zone 21 may differ from the width of one side 24 of a polygon. Lastly, even though the invention advantageously allows membranes made entirely of germanium to be produced, it is naturally possible to implement the invention with a germanium-based alloy such as SiGe, SiGeSn or with stacks of layers made of various germanium-based materials.

Such a germanium membrane according to the invention allows a plurality of different types of optical and/or electronic devices to be produced. By way of example, mention may be made of diodes, transistors, light-emitting devices such as lasers, and photodetectors.

In these examples, the strained material is the active material for the envisaged application. However, this strained material may also be used as a new substrate material for growing another material that will then be the active material for the envisaged application. Specifically, it is well known that the quality of the crystal growth of a thin film of material on a substrate is highly dependent on the mismatch between the lattice parameters of the substrate and the layer: it is necessary for these two parameters to be as close as possible in order to prevent growth defects. Conventionally, this problem is for example solved by depositing an intermediate buffer layer before growing the active material in order to match the lattice parameters, but this requires additional fabrication steps. By virtue of the invention, it is possible to produce a substrate on demand, the lattice parameter of which will be adjusted to that of the active material: all that is required is to apply the strain required to stretch the crystal structure of the substrate until a lattice parameter as close as possible to that of the growth material is obtained, and then to carry out the growth. These variations may be substantial, of as much as a few percent.

FIGS. 7a to 7g show various steps of a process for fabricating a laser, more precisely a vertical-cavity surface emitting laser (VCSEL), incorporating germanium membranes according to one embodiment of the invention.

The first fabrication steps, shown in FIGS. 7a to 7d, correspond to the steps described above with reference to FIGS. 1a to 1d, and allow a membrane made of germanium to be obtained. In this embodiment, the shape of the membrane 20 is chosen to achieve a sufficient deformation of the active zone of higher than 1.6%, in order to obtain the laser effect using germanium. To do this, it is recommended to use the shape of the membrane 20 shown in FIGS. 3b and 6.

Figure 7A:
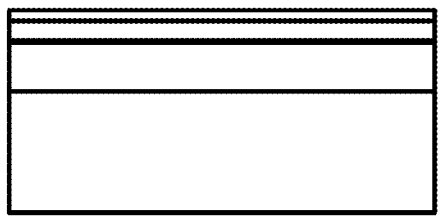
FIGS. 7a to 7g show various steps of fabrication of a laser incorporating germanium membranes according to one embodiment of the invention.
Figure 7B:
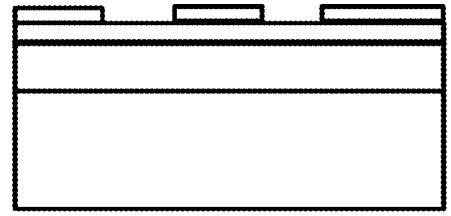
Figure 7C:
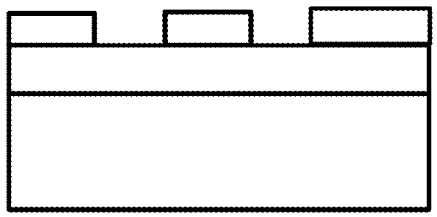
Figure 7D:
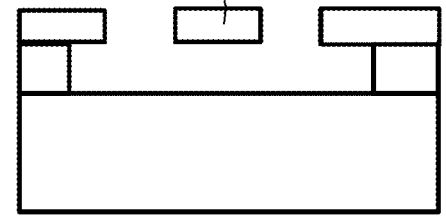
Figure 7E:
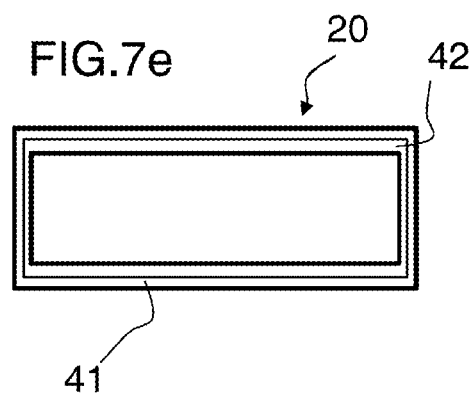
Figure 7F:
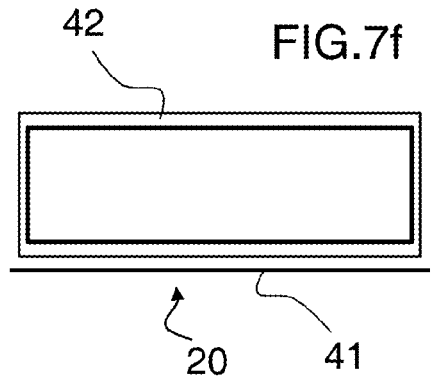
Figure 7G:
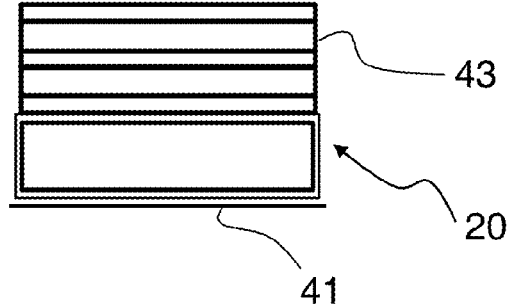

The process then comprises an additional step consisting in depositing aluminium on the germanium membrane 20, as shown by FIG. 7e. An additional step removes the aluminium located above and to the sides of the membrane 20, in order to leave finally only the aluminium layer under the membrane, as shown by FIG. 7f. To do this, argon beam etching may be implemented, care having been taken to place an alumina layer 42 under the aluminium in order to form a stop layer for this etching. The aluminium thus forms a first mirror 41.

Lastly, the top of the structure is covered with a conventional second mirror 43, a dielectric mirror for example and especially a Bragg mirror. To do this, layers of low and high refractive index may be deposited by evaporation, in order to obtain the membrane 20 illustrated by FIG. 7g, this membrane 20 comprising two mirrors, a lower mirror and an upper mirror. These layers are designed so as to induce little strain and not to affect the deformation of the membrane 20 in the active zone.

Figure 8:
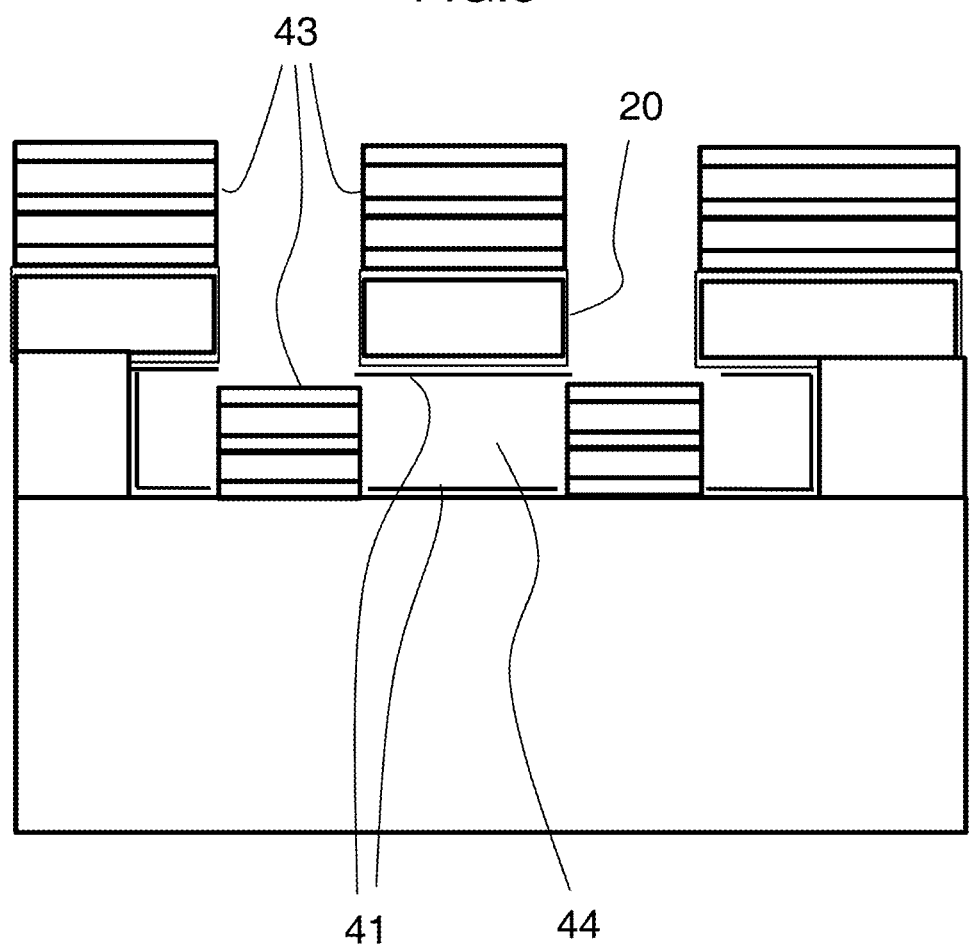
FIG. 8 shows the structure of a laser according to one embodiment of the invention.

FIG. 8 illustrates in cross section the structure of the laser obtained, this structure comprising a cavity 44 containing the two types of mirrors 41, 43.

Other laser configurations may be implemented by inserting layers between the membrane and the mirror in order to improve efficiency. Likewise, the cavity may be produced in the substrate 15. Lastly, to produce a horizontal laser (in which light propagates in the plane of the membrane), the membrane (active zone and/or arms) may be structured so as to have dimensions comprised between λ/10 and 10λ, in order to form a photonic crystal.

The invention claimed is:
1. Optical and/or electronic device comprising:
a suspended, germanium-based membrane,
wherein the membrane comprises an active zone placed under tension by at least three tensioning arms,
wherein at least one tensioning arm comprises nonparallel lateral sides,
wherein a width of the tensioning arm increases with distance from the active zone, and wherein the lateral sides of the tensioning arm make an obtuse angle to the active zone at a junction between the tensioning arm and the active zone.

2. The optical and/or electronic device according to claim 1, comprising at least one trapezoidal-shaped tensioning arm.

3. The optical and/or electronic device according to claim 1, wherein all the tensioning arms have a same shape and are distributed regularly about the active zone.

4. The optical and/or electronic device according to claim 1, comprising a substantially polygonal active zone.

5. The optical and/or electronic device according to claim 1, comprising links, wherein the links are rounded on a periphery of the active zone connecting two tensioning arms.

6. The optical and/or electronic device according to claim 1, which is at least one of a diode, a transistor, a light-emitting device, a laser, a photodetector and a substrate.

7. The optical and/or electronic device according to claim 6, which is an optical device and which comprises at least one of (i) a first mirror under the germanium-based membrane and (ii) a second mirror above the germanium-based membrane.

8. Process for fabricating an optical and/or electronic device, comprising:
    etching a germanium-based layer in order to form at least one tensioning arm comprising nonparallel lateral sides, wherein a width of the tensioning arm increases with distance from an active zone, and wherein the lateral sides of the tensioning arm make an obtuse angle to the active zone at a junction between the tensioning arm and the active zone; and
    etching a sacrificial layer under the germanium-based layer in order to obtain a suspended, germanium-based membrane comprising the active zone and the at least one tensioning arm,
    so as to obtain the optical and/or electronic device according to claim 1.

9. The process for fabricating an optical and/or electronic device according to claim 8, wherein the etching of the sacrificial layer extends gradually from the centre of the membrane, in a vicinity of the active zone, as far as an outside edge of the tensioning arms.

10. The process for fabricating an optical and/or electronic device according to claim 8, comprising at least one of (i) depositing a reflective layer in order to form a mirror under the membrane and (ii) depositing a reflective layer in order to form a mirror on the membrane.

11. The process for fabricating an optical and/or electronic device according to claim 10, comprising depositing a reflective layer of aluminum in order to form a mirror under the membrane.

12. The process for fabricating an optical and/or electronic device according to claim 10, comprising depositing a reflective layer of aluminum in order to form a mirror on the membrane.

13. The optical and/or electronic device according to claim 4, wherein the active zone forms a regular polygon, wherein the number of sides of the polygon is a multiple of the number of tensioning arms.

14. The optical and/or electronic device according to claim 2, wherein all the tensioning arms have a same shape and are distributed regularly about the active zone.

15. The optical and/or electronic device according to claim 2, comprising a substantially polygonal active zone.

16. The optical and/or electronic device according to claim 3, comprising a substantially polygonal active zone.

17. Optical and/or electronic device comprising:
    a suspended, germanium-based membrane comprising an active zone and tensioning arms,
    wherein the active zone is placed under tension by the tensioning arms,
    wherein at least one tensioning arm comprises nonparallel lateral sides,
    wherein a width of the tensioning arm increases with distance from the active zone,
    wherein the lateral sides of the tensioning arm make an obtuse angle to the active zone at a junction between the tensioning arm and the active zone, and
    wherein the membrane comprises links rounded on a periphery of the active zone connecting two tensioning arms.

18. The optical and/or electronic device according to claim 17, comprising at least one trapezoidal-shaped tensioning arm.

19. The optical and/or electronic device according to claim 17, wherein all the tensioning arms have a same shape and are distributed regularly about the active zone.

20. The optical and/or electronic device according to claim 17, comprising a substantially polygonal active zone.

* * * * *